United States Patent [19]

Gordon

[11] 4,224,534

[45] Sep. 23, 1980

[54] TRI-STATE SIGNAL CONDITIONING METHOD AND CIRCUIT

[75] Inventor: Gary B. Gordon, Saratoga, Calif.

[73] Assignee: Hewlett-Packard Company, Palo Alto, Calif.

[21] Appl. No.: 825,343

[22] Filed: Aug. 17, 1977

[51] Int. Cl.² ............................................... H03K 5/08
[52] U.S. Cl. .................................. 307/261; 307/209;
307/268; 307/360; 328/164
[58] Field of Search ............... 307/209, 264, 268, 354,
307/360, 261; 328/146, 150, 151, 164

[56] References Cited

U.S. PATENT DOCUMENTS

| 3,543,170 | 11/1970 | Diederich | 328/164 |
| 3,723,649 | 3/1973 | Pitegoff et al. | 328/164 X |
| 3,976,864 | 8/1976 | Gordon et al. | 324/73 R |

*Primary Examiner*—John Zazworsky
*Attorney, Agent, or Firm*—Allston L. Jones

[57] ABSTRACT

A method and apparatus for converting a tri-state logic signal into a two-state logic signal accurately and repeatably for purposes of signal measurement. In particular, the method and apparatus deal with how the third, or high impedance state is translated into a high or a low state. This is accomplished by including a resistor of a selected value to form a voltage divider with the resistance of the path through which the stray capacitance of the circuit under test charges during these intervals. Thus, the level of the final voltage charge is limited to a selected voltage that is intermediate the high and low state threshold voltages of that circuit. The initially conditioned signal, now a true tri-stage signal, is next applied to two threshold detectors, whose outputs in turn are applied to a state machine. This combination generates a repeatable two-state signal by identifying each occurrence of the third state as the last previous high or low state, i.e., the output of the conditioning circuit does not switch to the other state until both thresholds have been crossed by the signal in either direction, at the clock time. The resultant signal from the conditioning circuit has only two predictable and repeatable states, the low and the high states.

8 Claims, 4 Drawing Figures

TRI-STATE SIGNAL CONDITIONING METHOD AND CIRCUIT

BACKGROUND OF THE INVENTION

There are several techniques for the testing of digital circuits based on compressing bit streams. These include, for example, apparatus for counting the number of logic state transitions of, and apparatus for analyzing the signature of, an unknown logic signal, each during a selected period of time. Logic state transition counting and the associated apparatus is well known in the art and signature analysis is fully described in U.S. Pat. No. 3,976,864 issued on Aug. 24, 1976, to Gary Gordon, et al, and now assigned to the same assignee as the present invention.

With many logic circuits, there is the possibility that the output signal will assume a third state. For example, TTL gates have a high state and a low state which are defined by the voltage level of the signal, i.e., typically 2.0 volts and above is a high state and 0.8 volts and below is a low state. The third state occurs when the gate output line is floating or is in a high impedance state, i.e., when neither of the output transistors of the signal generating gate are conducting. If the third state is encountered by the prior art test instruments, it is unpredictable whether the third state will be identified as a high or a low state. Additionally, repeatability of identification of this state as a high or a low state cannot be ensured, i.e., a valid bit stream cannot be characterized by a unique signature if third state data is present.

When the gate output line at the point of measurement is not clamped to either of the high or low state levels (output line is floating), attempts were made in the prior art to make the logical signature unique by pulling the point of measurement to the high state through a resistor connected to Vcc. Thus, the output signal could vary from the low state level to the high state level through the intermediate region at a rate which is determined by the RC time constant, where R is the value of the pull-up resistor and C is the value of the stray capacitance to ground of the gate output line where the signal measurement is being made. If transition counting is being used, the transition may be multiply detected if the charging time constant is sufficiently long so that system noise causes the high-low state threshold to be multiply traversed. With a position-sensitive bit stream characterizing system, such as signature analysis, the resulting signature will then vary undesirably.

To obtain an accurate measure of a logical signal, some means is therefore required to eliminate the effect of the floating gate output, and to identify the third state repeatably and uniquely as either the high or as the low state, or to determine when each state transition has occurred.

SUMMARY OF THE INVENTION

In accordance with the illustrated embodiment, the present invention provides a method and apparatus for generating a repeatable binary signal from a tri-state signal.

To provide for a repeatable identification of the tri-state signal when the gate output is in the third state, (i.e., the high impedance state) the signal is initially conditioned so that it repeatedly achieves a signal level intermediate the threshold levels that define the high and low states. The conditioned tri-state signal in these time intervals crosses only one of the high and low state signal threshold levels as the stray capacitance of the gate charges or discharges, i.e., the steady state signal level to which the stray capacitance charges (discharges) is intermediate the high and low state signal threshold levels. This conditioning can be performed by coupling the signal input line of the present invention to a selected voltage that is intermediate the first and second threshold voltage levels through a selected value resistor.

To generate a binary signal, the initially conditioned tri-state signal is sampled at the clock rate of the original tri-state signal and in any interval wherein the signal has a level intermediate the high and low state threshold levels, the signal is defined to be in the same state as the last previous one of the high and low states of the signal. This is accomplished by the illustrated preferred embodiments in one case by first sampling the conditioned tri-state signal at the clock rate of the tri-state signal by means of a transmission gate followed by a hysteresis amplifier wherein the two threshold levels are selected to correspond to the high and low threshold signal levels of the tri-state signal under test. Thus, the output signal of the hysteresis amplifier will be a binary signal wherein each third state has been identified as above, and each high and low state of the tri-state signal is, correspondingly converted to a high and low state, respectively. The other illustrated embodiments of the present invention combine the sampling and hysteresis functions in a state machine to achieve the same result.

DESCRIPTION OF THE PREFERRED EMBODIMENT

Figure 1:
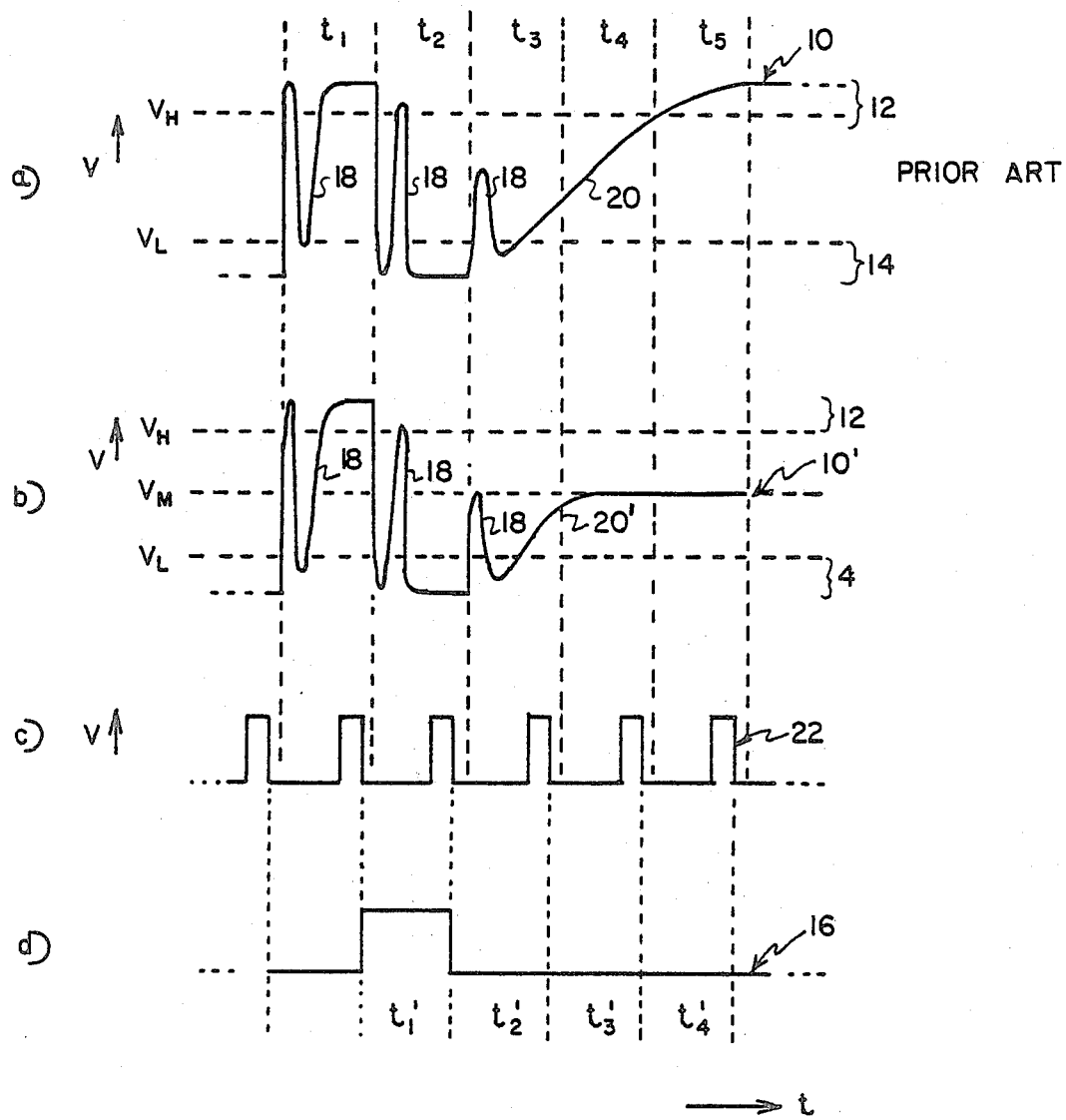
FIG. 1a shows a portion of a typical logic signal as conditioned by the prior art.
FIG. 1b shows the logic waveform of FIG. 1a with the intervals resulting from the high impedance state of the generating gate initially conditioned instead by the preferred embodiment of the present invention.
FIG. 1c shows the clock pulse train and its temporal alignment with the logic waveforms of FIGS. 1a, b and c.
FIG. 1d shows the logic waveform of FIG. 1a following complete conditioning by the preferred embodiment of the present invention.

In FIG. 1a there is shown a portion of a typical logic signal waveform 10. This waveform includes a high state region 12 and a low state region 14. High state region 12 is defined as that portion of the signal that assumes a voltage level equal to or greater than the high state threshold voltage level, $V_H$, and low state region 14 is defined as that portion of the signal having a voltage level equal to or less than the low state threshold voltage level, $V_L$. State transition ringing pulses 18 are also shown, and it is not unusual for these noise pulses to overshoot and extend between and into the high and low logic state voltage levels, as shown in intervals t1 and t2. Additionally, an unclamped gate output portion 20 of the signal is shown in intervals t3, t4 and t5. This unclamped portion 20 of the signal is shown varying from the low state to the high state which occurs when the output of a gate is not clamped to either of the high state or the low state voltage levels, and a pull-up resistor is connected between the output terminal of the gate and $V_{cc}$. The time constant with which the unclamped portion 20 of the signal varies is dependent upon the value of the stray capacitance of the gate and the resistance of its charging path.

FIG. 1b shows a logic signal waveform 10', and FIG. 1c the corresponding clock waveform 22 of the circuit that generated waveform 10'. Waveform 10' is the same as waveform 10 in FIG. 1a with the unclamped portion 20' shown charging toward a voltage level, $V_M$, which is intermediate the voltage threshold levels $V_H$ and $V_L$. This change results from the first step of the signal conditioning of the present invention described below.

FIG. 1d shows logic signal 16 which is the completely conditioned logic signal output of the present invention. It can also be seen that the transitions of conditioned signal 16 are in alignment with the trailing edges of the individual pulses of the clock pulse train 22. Thus, the final logic signal is delayed from the original signal 10 by approximately one full time interval.

Figure 2A:
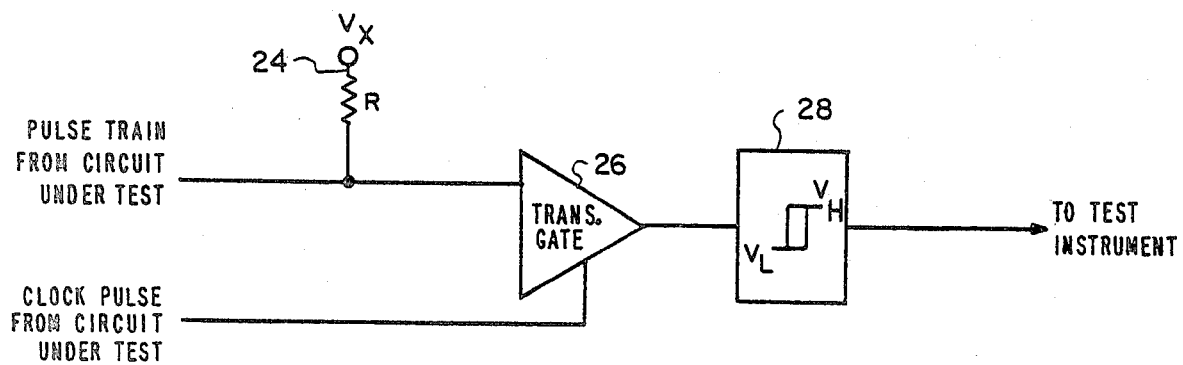
FIGS. 2a and 2b each show a simplified block diagram of a preferred embodiment of the present invention.
Figure 2B:
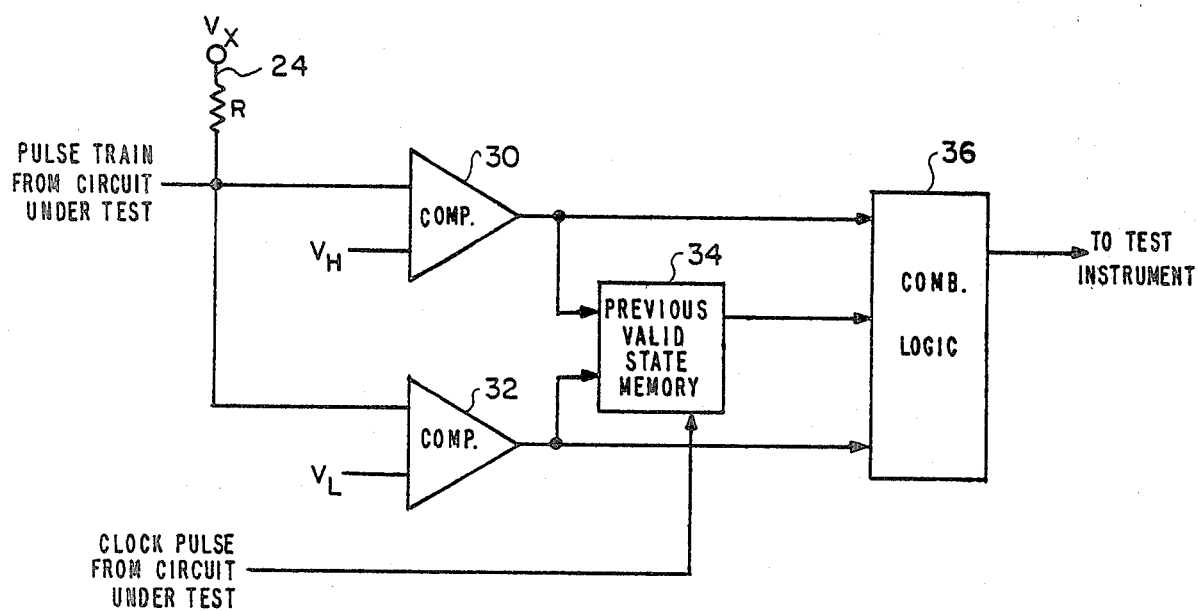

FIGS. 2a and 2b illustrate an analog and a digital circuit, respectively, of the present invention in simplified block diagram form. In each of these figures, and in FIG. 3, there is shown a resistor 24 connected between a voltage source $V_X$ and the input line of the overall circuit for receiving the pulse train of interest (10, FIG. 1a) from the circuit under test. The value of voltage source $V_X$ is selected so that $V_X=(V_H+V_L)/2$ (e.g. $V_X=1.4$ v for testing TTL gates). Resistor 24 is selected so that the high and low state voltage levels of waveform 10' (FIG. 1b) do not fall below or rise above thresholds $V_H$ and $V_L$, respectively, when the output of the circuit under test is in one of the clamped modes (FIG. 1b intervals t1 and t2 i.e. those portions of waveform 10' in intervals $t_1$ to $t_2$ other than ringing pulses 18), and so that the stray capacitance of the circuit under test does not charge from leakage currents to a voltage level that is greater than $V_L$ or less than $V_H$ when the output of the circuit under test is in the unclamped mode (e.g., in TTL circuits $R_{24} \approx 50$ K $\Omega$, $V_X=1.4$ v, $V_M=1.4$ v, $V_H=2.0$ v, $V_L=0.8$ v). Thus, resistor 24 and the $V_X$ voltage level limit the maximum extent of the unclamped gate output portion 20' (FIG. 1b) of the waveform of interest (10') to the region between $V_L$ and $V_H$. It should be mentioned that a current source could be used instead of R24 to achieve the function R24 performs.

The remainder of the circuit illustrated in FIG. 2a comprises a transmission gate 26 (e.g., a field effect transistor) with its input connected to receive the pulse train of interest (10') from resistor 24, and its gate connected to receive the clock pulses (22) from the circuit under test. The output signal from transmission gate 26 is then a clocked, preconditioned, tri-state signal. This tri-state signal is then applied to a hysteresis amplifier 28 (e.g., an operational amplifier with positive feedback) which generates a two-state output signal wherein a state transition does not occur until the clocked, preconditioned, tri-state signal crosses both hysteresis thresholds in either direction, i.e., when the input signal level is $V_M$, the hysteresis amplifier 28 continues to output the last previous clamped state until the second threshold is also crossed. Thus, by preconditioning the unclamped portions 20 (FIG. 1 intervals t3, t4 and t5) of the input waveform with resistor 24 and voltage source $V_X$, by gating the input signal with the clock pulse 22 of the circuit under test, and by using a hysteresis amplifier 28, the unpredictable effects of the unclamped output (20) of the circuit under test, and the transition ringing (18) are eliminated, and a predictable and repeatable two-state signal is generated making effective and accurate transition counting or signature analysis possible.

In addition to resistor 24 and voltage source $V_X$, FIG. 2b also includes a pair of comparators 30 and 32 (e.g., LM710'S) each coupled to receive on one input terminal the preconditioned waveform from resistor 24. The second input terminal of comparators 30 and 32 are coupled to voltage sources having output voltage values of $V_H$ and $V_L$, respectively, for producing an output signal in the high state when the preconditioned input signal (10') voltage level exceeds the respective threshold level ($V_H$ or $V_L$) and a low state otherwise. The output signals from comparators 30 and 32 are next applied to a memory 34 (e.g., a flip-flop) for storing the last previous valid (clamped) state of the input signal (10') in response to the applied clock pulse from the circuit under test. Next, the output signals of comparators 30 and 32 and single bit memory 34 are applied to a combinatorial logic circuit 36 which is designed to produce a logical output signal in accordance with the Table I.

TABLE I

| Input State | Comp 30 Output | Comp 32 Output | Memory 34 Output | Output from 36 |
|---|---|---|---|---|
| L | L | L | L | L |
| L | L | L | H | L |
| 3d | L | H | L | L |
| 3d | L | H | H | H |
| (impossible) | H | L | L | — |
| (impossible) | H | L | H | — |
| H | H | H | L | H |
| H | H | H | H | H |

Figure 3:
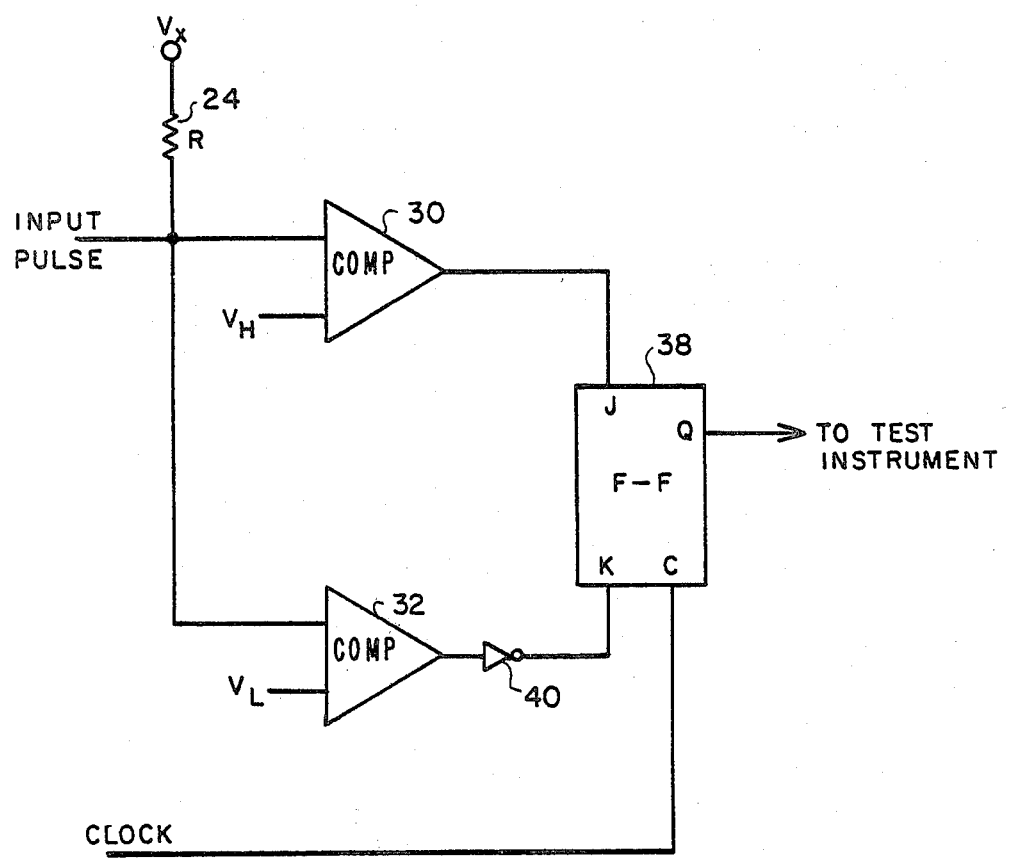
FIG. 3 shows another preferred embodiment of a logical third state conditioning circuit.

One digital logic circuit embodiment of the present invention is shown in FIG. 3. This embodiment includes resistor 24 and comparators 30 and 32 connected and operative as described in relation to FIG. 2b. The circuit also includes a J-K Flip-Flop 38 with the output of comparator 30 coupled to the J terminal and the output of comparator 32 coupled to the K terminal through an inverter 40. Also coupled to the J-K Flip-Flop 38 at its clock input terminal is the clock pulse train (22, FIG. 1c) from the circuit under test. The Q output signal of J-K Flip-Flop 38 represents the output signal of the conditioning circuit. Table II illustrates the operation of this circuit.

TABLE II

| Input State | Comp 30 Output | (J) | Comp 32 Output | (K) | Previous Q38 | Next Q38 | Output |
|---|---|---|---|---|---|---|---|
| L | L | L | L | H | L | L | L |
| L | L | L | L | H | H | L | L |
| 3d | L | L | H | L | L | L | L |
| 3d | L | L | H | L | H | H | H |
| (impossible) | H | H | L | H | L | — | — |
| (impossible) | H | H | L | H | H | — | — |
| H | H | H | H | L | L | H | H |
| H | H | H | H | L | H | H | H |

I claim:
1. A method of generating a repeatable binary signal from a tri-state signal to characterize said tri-state signal for testing, both signals having the same preselected clock rate, and said tri-state signal being the output signal of a logic circuit wherein the output signal has a high state region, a low state region, and a floating region, said high and low state regions being defined by the logic circuit when its output stage is clamped to a voltage level that is greater than or less than a first and a second signal threshold level, respectively, and said floating region occurring when the output stage of the logic circuit is unclamped to any voltage level, the method comprising the steps of:

a. limiting the variation of the tri-state signal in the floating regions to a single transition of one of said first and second signal threshold levels;

b. sampling the limited tri-state signal of step a. in relation to the preselected clock rate; and c. identifying the sampled, limited high and low state regions of the tri-state signal as high and low states, respectively, and identifying its regions limited in step a. as being in the same state as the last previous one of the high and low state regions.

2. A method of generating a repeatable binary signal as in claim 1 wherein step a. includes pulling the tri-state signal in the floating regions toward a signal level intermediate said first and second signal threshold levels.

3. A method of generating a repeatable binary signal as in claim 1 wherein step c. includes:

d. storing the state level of the last previous one of the high and low state regions of the tri-state signal as limited in step a.;

e. comparing the signal level of the tri-state signal as limited in step a. in each of its regions to said first and second threshold signal levels; and f. generating a signal in response to the preselected clock rate, said signal having a high state region in response to both of said first and second signal threshold levels being exceeded in the signal comparing step e., a low state region in response to neither of said first and second signal threshold levels being exceeded in the signal comparing step e., and having a state region with the same state level as the state level retained in the storing step d. when the signal level of the tri-state signal limited as in step a. is intermediate said first and second signal threshold levels.

4. An apparatus for generating a repeatable binary signal from a tri-state signal to characterize said tri-state signal for testing, both signals having the same preselected clock rate, and said tri-state signal being the output signal of a logic circuit wherein the output signal has a high state region defined as that region wherein the output stage of the logic circuit is clamped to a voltage level above a first signal threshold level, a low state region defined as that region when the output stage of the logic circuit is clamped to a voltage level below a second signal threshold level, and a floating region in those intervals when the output stage of the logic circuit is unclamped to any voltage level, said apparatus comprising:

first means coupled to receive said tri-state signal for limiting the variation of the tri-state signal in the floating regions to a single transition of one of said first and second signal threshold levels; and second means for sampling the tri-state signal as limited by the first means in relation to the preselected clock rate to identify its high and low state regions as high and low states, respectifely, and to identify its floating regions as being in the same state as the last previous one of the high and low state regions.

5. An apparatus for generating a repeatable binary signal as in claim 4 wherein said first means includes:

input means coupled to receive said tri-state signal; and a resistor with one end connected to the input means and the second end coupled to receive a preselected voltage level to pull the signal level in the floating regions of the tri-state signal toward a signal level intermediate said first and second signal threshold levels.

6. An apparatus for generating a repeatable binary signal as in claim 4 wherein said second means includes:

transmission gate means coupled to said first means for sampling the tri-state signal as limited by the first means at the preselected clock rate; and hysteresis amplifier means coupled to the transmission gate means for identifying the states of the various regions of the sampled signal.

7. An apparatus for generating a repeatable binary signal as in claim 4 wherein said second means includes:

first comparator means coupled to receive the tri-state signal as limited by, and from, said first means for generating a first binary signal having a high state when the limited tri-state signal level exceeds said first signal threshold level and a low state otherwise;

second comparator means coupled to receive the tri-state signal as limited by, and from, said first means for generating a second binary signal having a high state when the limited tri-state signal level exceeds said second signal threshold level and a low state otherwise; and state machine means coupled to receive said first and second binary signals for generating in relation to the preselected clock rate, the repeatable binary signal having a high state region when both first and second binary signals are in the high state, a low state region when both first and second binary signals are in the low state, and the last previous one of the high and low states when the first binary signal is in the low state and the second binary signal is in the high state.

8. An apparatus for generating a repeatable binary signal as in claim 7 wherein said state machine means includes:

inverter means for inverting the states of said second binary signal; and a J-K flip-flop coupled to receive said first binary signal at its J terminal, and the inverted second binary signal at its K terminal to generate at its Q terminal in response to the preselected clock rate signal on its clock terminal the repeatable binary signal.

* * * * *